(12) United States Patent
Perego et al.

(10) Patent No.: US 10,698,003 B2
(45) Date of Patent: Jun. 30, 2020

(54) TESTING HEAD COMPRISING VERTICAL PROBES FOR REDUCED PITCH APPLICATIONS

(71) Applicant: TECHNOPROBE S.p.A., Cernusco Lombardone (IT)

(72) Inventors: Daniele Perego, Cernusco Lombardone (IT); Simone Todaro, Cernusco Lombardone (IT)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 206 days.

(21) Appl. No.: 15/801,067

(22) Filed: Nov. 1, 2017

(65) Prior Publication Data
US 2018/0052190 A1 Feb. 22, 2018

Related U.S. Application Data

(63) Continuation-in-part of application No. PCT/EP2016/060123, filed on May 5, 2016.

(30) Foreign Application Priority Data

May 7, 2015 (IT) .................. 102015000014187

(51) Int. Cl.
*G01R 1/073* (2006.01)
*G01R 1/067* (2006.01)

(52) U.S. Cl.
CPC ..... *G01R 1/07357* (2013.01); *G01R 1/06733* (2013.01); *G01R 1/07364* (2013.01);
(Continued)

(58) Field of Classification Search
CPC ............ G01R 1/07357; G01R 1/06733; G01R 1/07364; G01R 1/07342; G01R 1/07314; G01R 1/06716
See application file for complete search history.

(56) References Cited

U.S. PATENT DOCUMENTS

| 5,923,178 A * | 7/1999 | Higgins | G01R 31/2831 324/754.11 |
| 6,060,892 A * | 5/2000 | Yamagata | G01R 31/2887 324/754.07 |

(Continued)

FOREIGN PATENT DOCUMENTS

| JP | 5144997 B | † 11/2012 |
| JP | 5323741 B | † 7/2013 |

*Primary Examiner* — Christopher P McAndrew
*Assistant Examiner* — Zannatul Ferdous
(74) *Attorney, Agent, or Firm* — Seed Intellectual Property Law Group LLP

(57) ABSTRACT

A testing head for testing the working of a device under test comprises a plurality of contact probes, each contact probe having a rod-like body of a predetermined length that extends between a first end and a second end and being housed in respective guide holes made in at least one plate-like lower guide and one plate-like upper guide that are parallel to each other and spaced apart by a bending zone. Suitably, at least one of the lower guide and upper guide is equipped with at least one recessed portion formed at a plurality of those guide holes and realizing lowered portions thereof adapted to reduce a thickness of the plurality of those guide holes.

30 Claims, 11 Drawing Sheets

(52) U.S. Cl.
CPC ...... *G01R 1/06716* (2013.01); *G01R 1/07314* (2013.01); *G01R 1/07342* (2013.01)

(56) References Cited

U.S. PATENT DOCUMENTS

| | | | |
|---|---|---|---|
| 6,404,211 B2 † | 6/2002 | Hamel | |
| 6,825,052 B2 † | 11/2004 | Eldridge | |
| 7,554,348 B2 † | 6/2009 | Brandorff | |
| 8,087,956 B2 † | 1/2012 | Nakayama | |
| 8,103,992 B1 * | 1/2012 | Chan | G06F 17/5054 716/100 |
| 2009/0072849 A1 * | 3/2009 | Dickson | G01R 1/07371 324/763.01 |
| 2009/0140760 A1 | 6/2009 | Narita et al. | |
| 2009/0224782 A1 | 9/2009 | Chen et al. | |
| 2011/0006796 A1 * | 1/2011 | Kister | G01R 1/07314 324/756.01 |
| 2011/0006799 A1 * | 1/2011 | Mochizuki | G01R 3/00 324/756.07 |
| 2011/0043232 A1 * | 2/2011 | Takase | G01R 1/07342 324/755.01 |
| 2012/0068727 A1 * | 3/2012 | Rathburn | G01R 1/07314 324/755.01 |
| 2013/0265074 A1 * | 10/2013 | Sato | G01R 1/06711 324/755.01 |
| 2014/0197860 A1 * | 7/2014 | Hsu | G01R 1/07357 324/756.07 |
| 2014/0266274 A1 * | 9/2014 | Shiraishi | G01R 1/07357 324/750.25 |
| 2016/0054356 A1 * | 2/2016 | Carvalho | G01R 1/06794 324/750.24 |

\* cited by examiner
† cited by third party

TESTING HEAD COMPRISING VERTICAL PROBES FOR REDUCED PITCH APPLICATIONS

BACKGROUND

Technical Field

The present disclosure refers to a testing head including a plurality of vertical probes, in particular for reduced pitch applications.

More specifically, the disclosure refers to a testing head having vertical probes for testing the working of a device under test, the testing head including a plurality of contact probes, each contact probe having a rod-like body of a preset length extending between a first end and a second end and being housed in respective guide holes made in at least one lower guide and one upper guide, the guides being plate-like, parallel to each other and spaced apart by a bending area.

Particularly but not exclusively, the disclosure relates to a testing head to test electronic devices that are integrated on a wafer and the following description is made with reference to this application field with the only purpose of simplifying its exposition.

Description of the Related Art

As it is well known, a testing head (or probe head) is a device apt to place a plurality of contact pads of a microstructure into electrical contact with corresponding channels of a testing machine performing the working test thereof, in particular the electrical one, or generically the test.

The test, which is performed on integrated circuits, is particularly useful to detect and isolate defective circuits yet in the manufacturing step. Usually, the testing heads are thus used for electrically testing the circuits integrated on a wafer before cutting and assembling them inside a chip-containing package.

A testing head basically includes a plurality of mobile contact elements or contact probes that are held by at least a pair of substantially plate-like supports or guides that are parallel to each other. Those plate-like supports are provided with suitable holes and are arranged at a certain distance from each other so as to leave a free space or gap for the movement and possible deformation of the contact probes. In particular, the pair of plate-like supports includes an upper plate-like support and a lower plate-like support, both provided with guide holes where the contact probes axially slide, the contact probes being usually made of special alloy wires having good electrical and mechanical properties.

The good connection between the contact probes and the contact pads of the device under test is guaranteed by pressing the testing head on the device itself, the contact probes, which are movable within the guide holes made in the upper and lower plate-like supports, undergoing a bending inside the gap between the two plate-like supports and sliding within such guide holes during that pressing contact. Testing heads of this kind are usually called "vertical probe heads".

The testing heads with vertical probes have a gap where a bending of the contact probes occurs, that bending being assisted by a proper configuration of the probes themselves or of their supports, as schematically shown in FIG. 1, where, for the sake of illustration simplicity, only one contact probe of the plurality of probes usually included in a testing head has been shown.

In particular, FIG. 1 schematically shows a testing head 1 including at least one lower plate-like support, usually called "lower die" or simply lower guide 2, and an upper plate-like support, usually called "upper die" or simply upper guide 3, the supports having respective guide holes 2A and 3A inside which at least one contact probe 4 slides.

The contact probe 4 ends at an end with a contact tip 4A intended to abut onto a contact pad 5A of a device under test 5, in order to realize the electrical and mechanical contact between such a device under test 5 and a testing apparatus (not shown) of which that testing head 1 is a terminal element.

Here and in the following, the term "contact tip" means an end zone or region of a contact probe intended to contact the device under test or the testing apparatus, that end zone or region not necessarily being sharp.

In some cases, the contact probes are fixedly fastened to the head itself at the upper guide 3: those testing heads are referred to as blocked probe testing heads. However, it is more common to use testing heads having non-fixedly fastened probes, but interfaced to a so-called board, possibly by means of a micro contact board: those testing heads are referred to as non-blocked probe testing heads. The micro contact board is usually called "space transformer" because, besides contacting the probes, it also allows spatially redistributing the contact pads made on it with respect to the contact pads made in the device under test, in particular relaxing the distance constraints between the centers of the pads themselves.

In this case, as shown in FIG. 1, the contact probe 4 has another contact tip, indicated as contact head 4B, towards a pad 6A of a plurality of contact pads of the space transformer 6. The good electrical contact between probes 4 and space transformer 6 is always ensured by the pressing contact of the contact heads 4B of the contact probes 4 against the contact pads 6A of the space transformer 6.

The lower 2 and upper 3 guides are suitably separated by a gap 7 allowing the deformation of the contact probes 4. Finally, the guide holes 2A and 3A are sized in order to allow the contact probe 4 to slide thereinto.

In case of a testing head made by means of the so-called "shifted plate technology", the contact probes 4, which are also called "buckling beams", are made straight, the shift of the guides causing a bending of the body of the probes and causing the desired holding of the probes themselves due to the friction with the walls of the guide holes where they slide. In that case, those testing heads are referred to as testing heads having shifted plates or guides.

The shape of the bending to which the probes undergo and the force causing that bending depend on several factors, such as the physical characteristics of the alloy of the probes and the value of the offset between the guide holes in the upper guide and the corresponding guide holes in the lower guide.

The proper operation of a testing head is linked to two parameters: the vertical movement, or overtravel, of the contact probes and the horizontal movement, or scrub, of the contact tips of those contact probes. It is in fact known that it is important to ensure the scrub of the contact tips in order to allow scratching the surface of the contact pads, in this way removing the impurities, for example in the form of a thin oxide layer or film, thus enhancing the contact that is carried out by the testing head.

All these characteristics are to be evaluated and calibrated in the manufacturing step of a testing head and the good electrical connection between probes and device under test, in particular between contact tips of the probes and contact pads of the device under test, should be always guaranteed.

It is equally important to guarantee the proper sliding of the probes 4 within the guide holes 2A and 3A of the guides during the operation of the testing head 1, and thus it is important to guarantee the bending of those probes 4 inside the gap 7, which is also indicated as bending zone.

Practically, this implies that a clearance (play) or tolerance has to be always guaranteed between the transversal dimensions or diameters of the contact probes 4 and of the guide holes 2A and 3A of the lower 2 and upper 3 guides, respectively.

However, this requirement is in contrast with the growing desire of contact probe packing inside the testing heads, so as to be able to make the corresponding contact tips closer and to allow the proper testing of the last generation integrated devices that include distributions of extremely close contact pads and thus very small values of the so-called pitch, namely the distance between the centers of adjacent contact pads, these devices being called fine pitch devices.

In particular, in order to test fine pitch devices, it is advantageous, besides reducing the transversal dimensions of the probes and thus of the corresponding guide holes, to limit the tolerance between probe and hole as much as possible.

In the commercially available testing heads, ceramic guides having a minimum thickness equal to 250 μm are usually employed. The fine pitch devices require realizing, in those ceramic guides, guide holes having a probe-hole tolerance reduced by 20-40% with respect to the commercially available devices.

However, it has been experimentally verified that these reduced tolerance values cause insurmountable sliding problems of the probes within the guide holes, compromising the proper operation of the testing head including them.

US Patent Publication No. US 2009/0224782 discloses a testing head that includes two parallel guides equipped with a plurality of single lowered portions, each lowered portion being realized at a guide hole that houses a contact probe, in this way improving the sliding properties of that contact probe.

BRIEF SUMMARY

An embodiment of the disclosure is directed to a testing head having such functional and structural characteristics to allow its use in the test of fine pitch devices, at the same time guaranteeing in a simple way a proper sliding of the contact probes within the guide holes made in the upper and lower guides, thus ensuring the proper operation of the testing head including them and overcoming the limitations and drawbacks still affecting the testing heads that are realized according to the prior art.

The testing head comprising vertical probes according to the disclosure reduces the friction between contact probes and respective guide holes thanks to a recessed portion realizing local lowered portions of the thickness of the guides wherein the guide holes are made, so as to reduce the frictions and therefore to prevent the problems of the probes getting stuck in those guide holes, at the same time guaranteeing a high packing of the probes themselves and therefore the possibility of testing a fine pitch device. As it will be clear from the following description, this solution is particularly useful in case of testing mixed pitch devices.

According to another aspect of the disclosure, the testing head comprises a plurality of contact probes, each contact probe having a rod-like body of a predetermined length that extends between a first end and a second end and being housed in respective guide holes made in at least one plate-like lower guide and one plate-like upper guide that are parallel to each other and spaced apart by a bending zone, wherein at least one of the lower guide and upper guide is equipped with at least one recessed portion formed at a plurality of those guide holes and realizing lowered portions thereof adapted to reduce a thickness of the plurality of those guide holes.

It is underlined that the recessed portion can be made only at the contact probes having a reduced diameter for the testing of at least one region of a fine pitch device.

According to another aspect of the disclosure, the recessed portion and lowered portions can have a thickness equal to 20-80% of a thickness of a corresponding guide wherein those lowered portions are made.

In particular, the thickness of the recessed portion and lowered portions can have a value adapted to reduce the thickness of the plurality of those guide holes, in which the contact probes slide, down to a value between 80 μm and 150 μm, preferably 100 μm.

According to another aspect of the disclosure, both the lower and upper guides can comprise guide holes provided with respective lowered portions due to respective recessed portions.

Furthermore, the testing head can comprise a first plurality of contact probes for testing contact pads of a first signal region of the device under test and a second plurality of contact probes for testing contact pads of a second power region of the device under test, the contact pads of the first region having pitches lower than pitches of the contact pads of the second region.

According to another aspect of the disclosure, the contact pads of the first region can have a diameter smaller than the contact pads of the second region.

Moreover, according to yet another aspect of the disclosure, the contact probes of the first plurality can have a probe diameter smaller than a probe diameter of the contact probes of the second plurality, diameter meaning a maximum transverse dimension of a section of the contact probes, which may be non-circular.

More in particular, the contact probes of the first plurality can carry signals, in particular input/output signals, having current values lower than signals, in particular power signals, carried by the contact probes of the second plurality.

According to another aspect of the disclosure, the contact probes of the second plurality can have a body of a length shorter than 5000 μm, and can include at least one opening or a non-through groove made longitudinally in the body.

Moreover, the plurality of those guide holes that are made at the recessed portion can house contact probes for testing contact pads of a region of the device under test having a lower pitch than the remaining contact probes housed in the testing head, that region being indicated as a fine pitch region.

The testing head can further comprise at least one intermediate guide associated with the lower guide or with the upper guide; in particular, the intermediate guide can be a lower intermediate guide, linked to the lower guide by a suitable link frame, disposed between the lower intermediate guide and the lower guide so as to act as a spacer element and as a connection element between those guides, and/or can be an upper intermediate guide, linked to the upper guide by a suitable additional link frame, disposed between the upper guide and the intermediate upper guide, so as to also act as a spacer element and as a connection element between those guides.

In that case, the intermediate guide can comprise at least one recessed portion realizing lowered portions at guide holes of the intermediate guide itself.

According to another aspect of the disclosure, at least one of those guides can be formed by at least one first and one second plate-like element being suitably integral with each other and having respective thicknesses lower than a thickness of the at least one of those guides formed by them, the first plate-like element being provided with openings, the second plate-like element being provided with guide holes, the openings corresponding to recessed portions realizing lowered portions at the guide holes.

According to another aspect of the disclosure, the testing head can comprise a plurality of recessed portions having different thicknesses with each other.

The testing head can further comprise at least one coating layer of those guides adapted to cover also those guide holes.

In particular, the coating layer can be made of a material having a low friction coefficient, for example can be selected from Teflon and Parylene.

The characteristics and advantages of the testing head according to the disclosure will be evident from the following description of an embodiment thereof given by way of non-limiting example referring to the attached drawings.

DETAILED DESCRIPTION

With reference to those figures, a testing head realized according to the present disclosure is described, that testing head being globally indicated with 20.

It should be noted that the figures represent schematic views and they are not drawn to scale, but instead they are drawn in order to emphasize the important characteristics of the disclosure. Moreover, in the figures, the different parts are shown schematically, as their shape can vary depending on the desired application.

Figure 1:
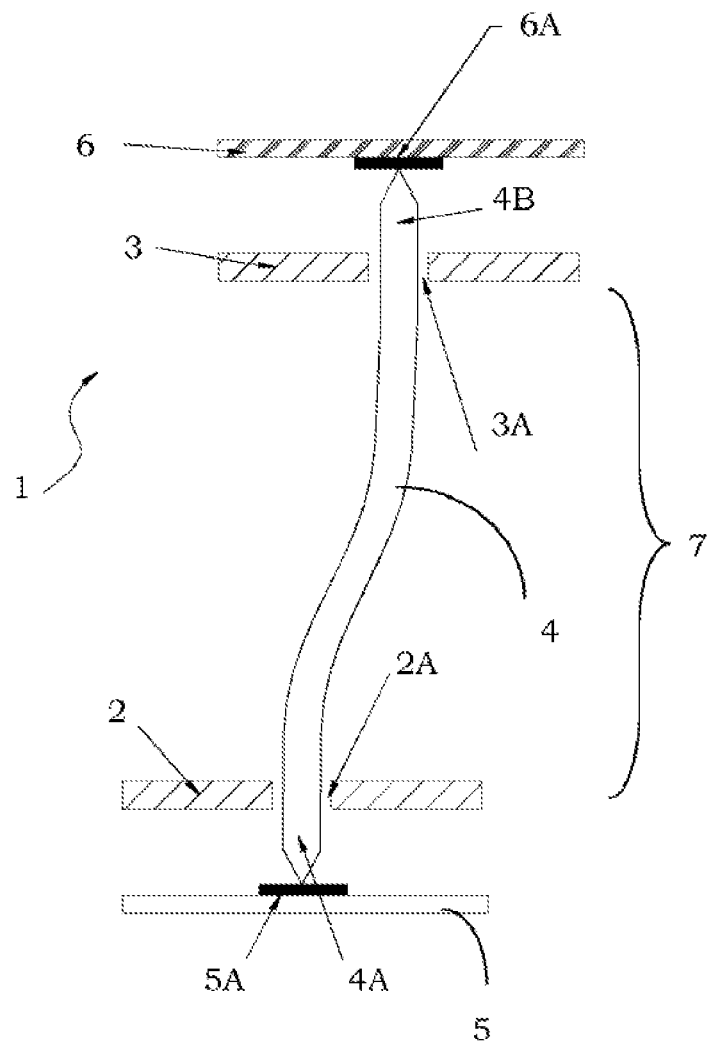
FIG. 1 schematically shows a testing head realized according to the prior art.
Figure 2:
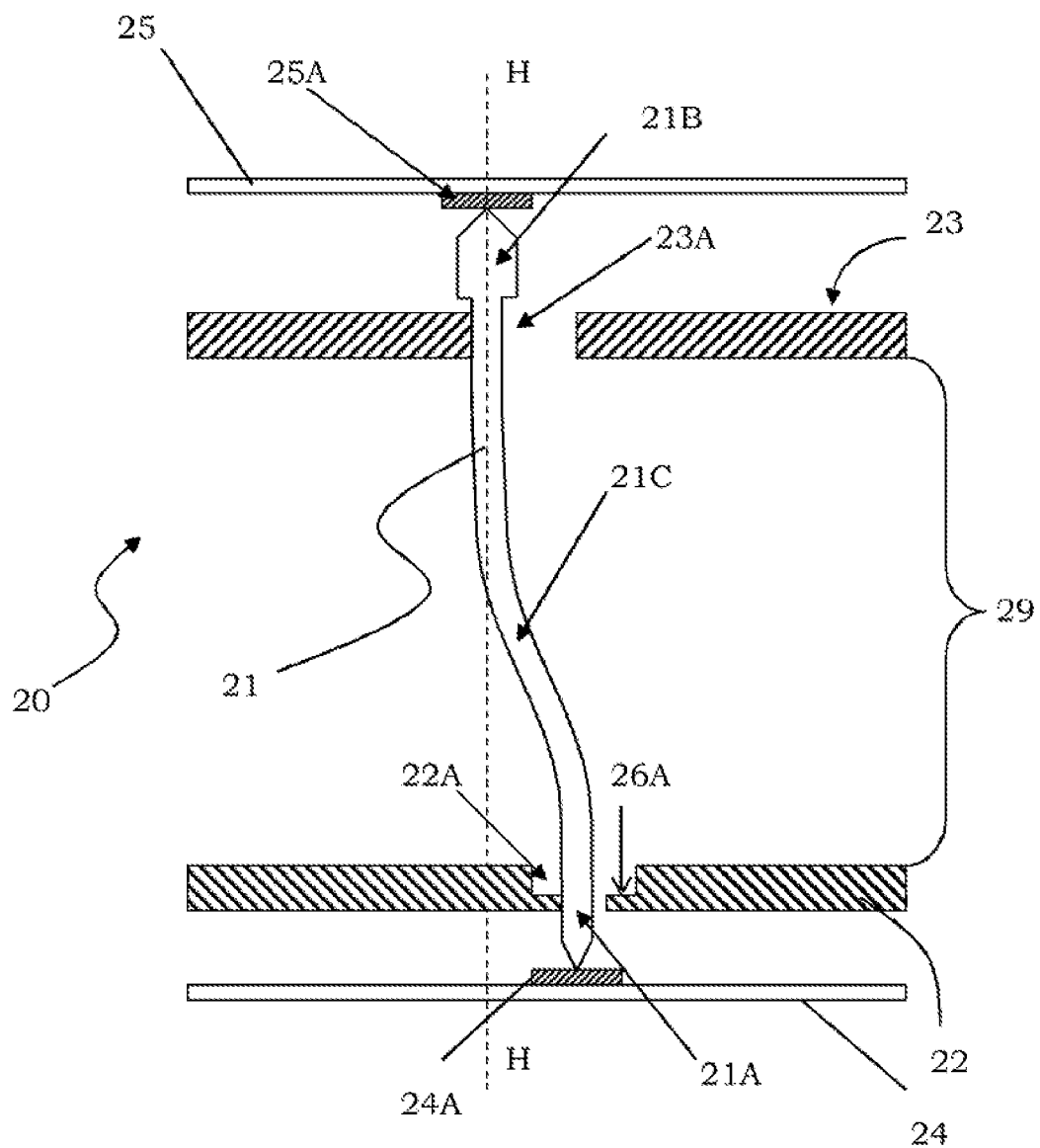
FIG. 2 schematically shows a testing head provided with at least a pair of guide and suitable guide holes, each guide hole including a lowered portion.

As shown in FIG. 2, a testing head 20 usually comprises a plurality of contact probes, each having at least one contact end apt to abut onto a contact pad of a device under test. For the sake of illustration simplicity and clarity, in FIG. 2 only one contact probe 21 is shown, that probe including a rod-like body 21C having a preset length, the term length meaning the longitudinal dimension of that body 21C in a non-warped configuration.

Each contact probe 21 also includes at least one first and one second end portion, in particular a contact tip 21A and a contact head 21B, which are contiguous to the body 21C.

In the example of FIG. 2, the testing head 20 is of the so-called shifted-plate type and includes at least one lower plate-like support or lower guide [lower die] 22 and at least one upper plate-like support or upper guide [upper die] 23 that are flat and parallel to each other and provided with respective guide holes, 22A and 23A, inside which a plurality of contact probes is slidingly housed, only one probe being shown in the figure for the sake of simplicity.

In particular, in the example of FIG. 2, the testing head 20 is also of the non-fastened probe type and the contact probe 21 has the contact tip 21A abutting onto at least one contact pad 24A of a device under test 24 and the contact head 21B abutting onto at least one contact pad 25A of a space transformer 25.

The lower 22 and upper 23 guides are substantially flat and parallel to each other, as well as parallel to the device under test 24 and to the space transformer 25, being spaced apart so as to define a gap or bending zone 29.

Those lower 22 and upper 23 guides are also provided with respective guide holes, 22A and 23A, suitable to house the contact probes 21 and to allow their sliding during the operation of the testing head 20, i.e. during the pressing contact of the contact tips 21A and of the contact heads 21B onto the contact pads 24A and 25A of the device under test 24 and of the space transformer 25, respectively.

Referring again to FIG. 2, at least one of the guides has a lowered portion 26A at a guide hole. It is underlined that such a lowered portion 26A is adapted to reduce the thickness of the guide hole contacting the contact probe 21 and therefore to reduce the friction problems explained in connection with the prior art.

The realization of these lowered portions 26A in correspondence of each guide hole clearly implies the use of precise and complex manufacturing techniques.

Figure 3A:
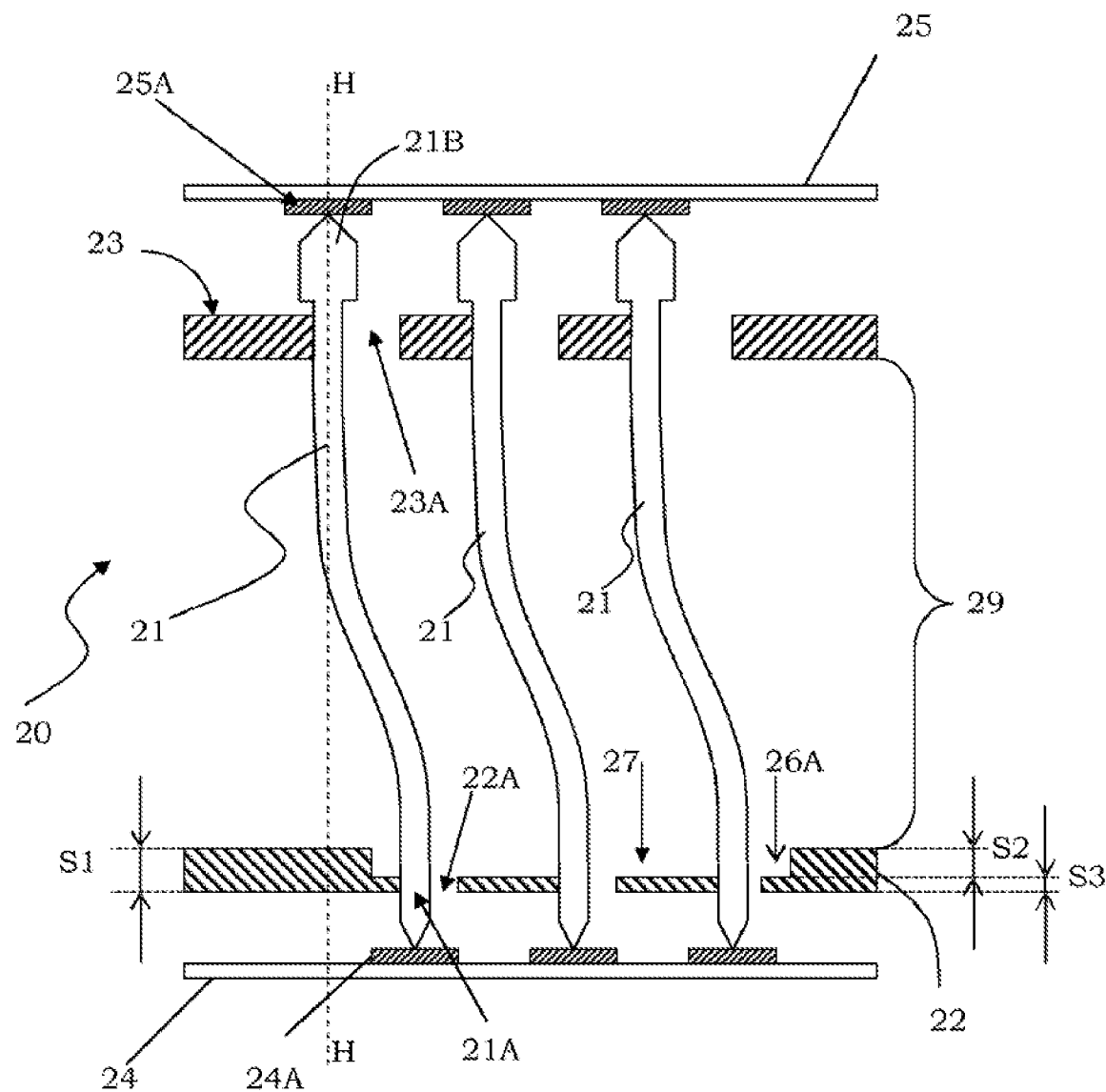
FIG. 3A schematically shows an embodiment of a testing head according to the disclosure.

Advantageously according to the present disclosure, as shown in FIG. 3A, the testing head 20 comprises a recessed portion 27 that is realized at a plurality of guide holes, which house respective contact probes 21, in particular used for a fine pitch region of the device under test, as it will be explained in details in the following. In that way, the recessed portion 27 realizes local lowered portions 26A of those guide holes. In the embodiment shown in FIG. 3A purely by way of example, that recessed portion 27 is realized in the lower guide 22; clearly it is possible to realize that recessed portion 27 in the upper guide 23 or in both guides, in particular in order to include a plurality of guide holes apt to house contact probes 21 that are used in a fine pitch region.

More particularly, each local lowered portion 26A is realized at a guide hole 22A made in the lower guide 22 due to the presence of the recessed portion 27. Moreover, considering a guide having a thickness S1, the lowered portion 26A has a thickness S2 equal to 20-80% of the thickness S1, which causes the thickness S3 of the guide hole 22A contacting the contact probe 21 to be less than the thickness S1 of the guide and particularly equal to 20-80% of that thickness S1.

By way of example, it is possible to consider a guide having a thickness S1 ranging from 150 µm to 500 µm, preferably 250 µm, and a lowered portion 26A having a thickness S2 ranging from 30 µm to 400 µm, preferably 150 µm. In that way, also the thickness S3 of the guide hole 22A contacting the contact probe 21 ranges from 30 µm to 400 µm, preferably 100 µm.

In a preferred embodiment, the recessed portion 27 is realized in order to bring the thickness S3 of the guide hole 22A contacting the contact probe 21 due to the presence of the lowered portion 26 to a value between 80 µm and 150 µm, preferably equal to 100 µm. Therefore, the value of the thickness S2 of that recessed portion 27 and thus of the lowered portions 26A is calculated as the difference between these preferred values of the thickness S3 and the thickness S1 of the guide where the recessed portion 27 is realized.

In that way, it is possible to verity that it is possible to reduce the tolerance values between probe and hole down to 6-10 µm, without negatively affecting the functionality of the testing head 20 and the sliding of the contact probes 21 included therein due to high frictions with the respective guide holes, also for probes having a diameter ranging from 20 µm to 50 µm, preferably from 20 µm to 30 µm, namely for probes that are normally used for testing the so-called fine pitch devices, namely having contact pads with a pitch less than 100 µm, preferably between 40 µm and 100 µm, also in a full array configuration, namely with pads arranged as a matrix. Here and in the following, the term diameter means a maximum transversal dimension of the probe, also a non-circular one.

In that regard, on the other hand, it is underlined that it is not possible to use whole guides having a thickness that is reduced down to the desired values, for example a lower guide 22 having a thickness S1 equal to 100 µm. Such a guide would not in fact be able to guarantee enough mechanical robustness to the testing head 20 as a whole, besides having problems of breakage during the manufacturing.

The thickness of the guide is lowered only at the guide holes, down to the value S3, where it is useful to reduce the sliding friction of the contact probes 21, the whole thickness S1 of the guide guaranteeing the necessary mechanical robustness.

The guide can also include a plurality of recessed portions 27 having a different thickness S2, thus realizing respective groups of guide holes having different values for the thickness S3.

It is also possible to realize the testing head 20 having recessed portions at both guides.

Figure 3B:
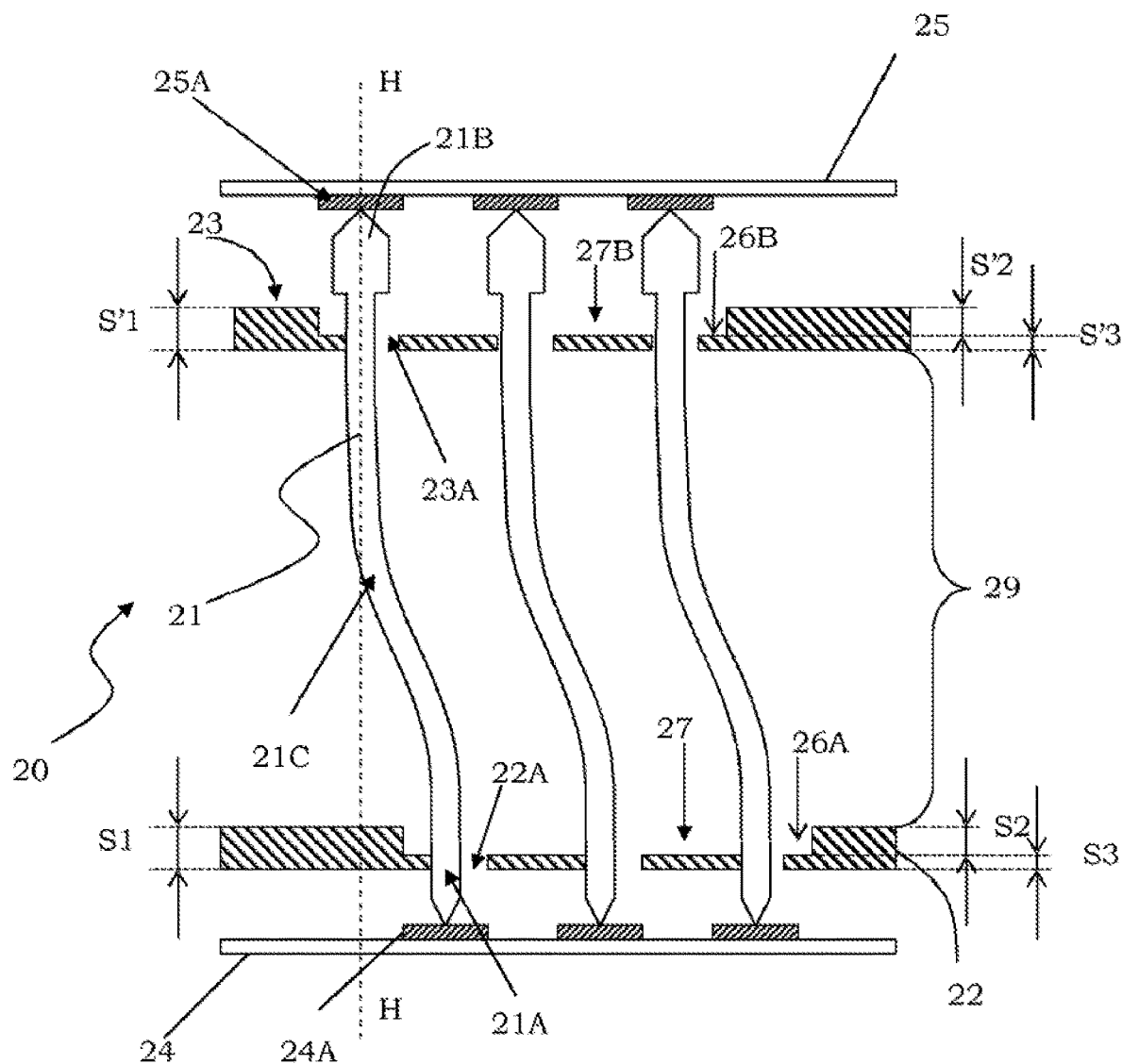
FIGS. 3B and 4A-4B schematically show alternative embodiments of the testing head according to the disclosure.

In particular, as schematically shown in FIG. 3B, the testing head 20 can thus include a further recessed portion 27B realizing lowered portions 26B also at the guide holes 23A that are realized in the upper guide 23.

Also in that case, the recessed portion 27B and thus the lowered portions 26B have a thickness S'2 equal to 20-80% of a thickness S'1 of the upper guide 23, which leads the thickness S'3 of the guide hole 23A contacting the contact probe 21 to a lower value than the thickness S'1 of the guide and particularly equal to 20-80% of that thickness S'1. The ranges of values of those thicknesses S'1, S'2 and S'3 of the upper guide 23 can be the same shown for the corresponding thicknesses S1, S2 and S3 of the lower guide 22, the corresponding thicknesses in the two guides having the same or different values depending on the applications.

Figure 4A:
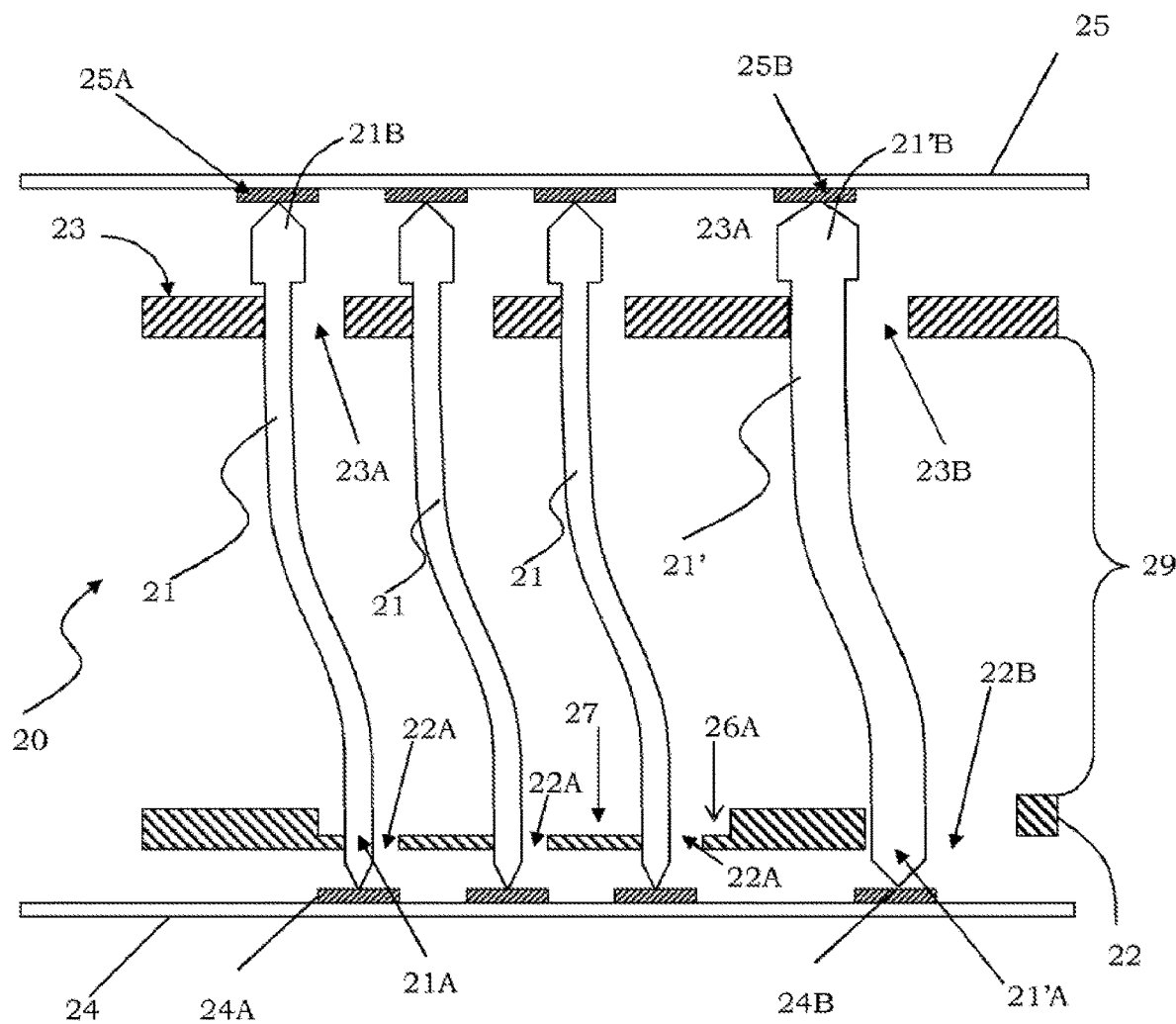

It is possible to use the shown expedients in order to realize a testing head 20 to test integrated devices having regions with different pitches, as schematically shown in FIG. 4A.

It is in fact known that the most recent development of the technology employed to realize integrated circuits has allowed realizing devices with bi-dimensional arrays of contact pads that have different relative distances or pitches in different regions of the device itself. More particularly, those regions having a different pitch usually include contact pads having different dimensions, dedicated to handle different signals.

In that case, it is possible to identify in the device under test at least one first region, which is called signal region, wherein the contact pads have a maximum transversal dimension or diameter and a distance between the relative centers that are less than the ones of a second region, which is called power region, wherein the pads are bigger and more far from each other. Generally, in the first signal region, input/output signals having current values around 0.5 A are handled, while, in the second power region, power supply signals having higher current values, around 1 A, are handled. In particular, the first region can be a fine pitch region.

As shown in FIG. 4A, in that case the testing head 20 includes a first plurality of contact probes 21 for testing the first signal region and a second plurality of contact probes 21' for testing the second power region, only three contact probes 21 for the first signal region and only one contact probe 21' for the second power region being shown in the figure by way of a non-limitative example. In particular, each the signal contact probes 21 has a cross-section, and in particular a transversal diameter, less than the one of the power contact probe 21'.

As previously shown, the testing head 20 includes the lower guide 22 and the upper guide 23, which are provided with respective first guide holes 22A, 23A to house the signal contact probes 21, and with second guide holes 22B, 23B to house the power contact probes 21'. The power contact probes 21' also include at least one contact tip 21'A and one contact head 21'B apt to abut onto contact pads 24B and 25B of the device under test 24 and of the space transformer 25, respectively.

Advantageously according to the present disclosure, at least one guide, in the shown example the lower guide 22, has at least one recessed portion 27 realizing a plurality of lowered portions 26A only at the guide holes 22A of the signal contact probes 21, which are smaller and intended to test the closest contact pads and which are for this reason the ones more prone to get stuck due to high frictions between contact probe 21 and guide hole 22A. The recessed portion 27 is realized only where it is more necessary, avoiding an unnecessarily weakening of the guide and saving machining. It is in fact underlined that the local lowered portions 26A, included in the recessed portion 27, and the resulting thickness reduction of the guide only affect a portion having a limited extension with respect to the extension of the guide itself, which can have even remarkable dimensions, in particular greater than 30 mm×30 mm.

It is also underlined that it is also important to guarantee that the pressing contact of the contact tips of the power contact probes 21', which have a bigger diameter than the diameter of the signal contact probes 21, on the contact pads of the device is not as high as to cause the breaking of the probe or the pad itself.

This issue is particularly important in the case of the so-called short probes, namely probes with a rod-like body having a limited length and particularly with dimensions less than 5000 µm. This kind of probes are used for example in high frequency applications, where the reduced length of the probes limits the related self-inductance phenomenon. In particular, the term "high frequency applications" means probes that are able to carry signals having frequencies higher than 100 MHz.

In that case, however, the reduced length of the probe body greatly increases the stiffness of the probe itself, which leads to an increase of the force that is exerted by the respective contact tip on the contact pads, for example of a device under test, which can lead to a breakage of those pads, irreparably damaging the device under test, which circumstance should be avoided. In a more dangerous way, the increase of the stiffness of the contact probe due to the reduction of its body length increases the risk of breaking the probes themselves.

Figure 4B:
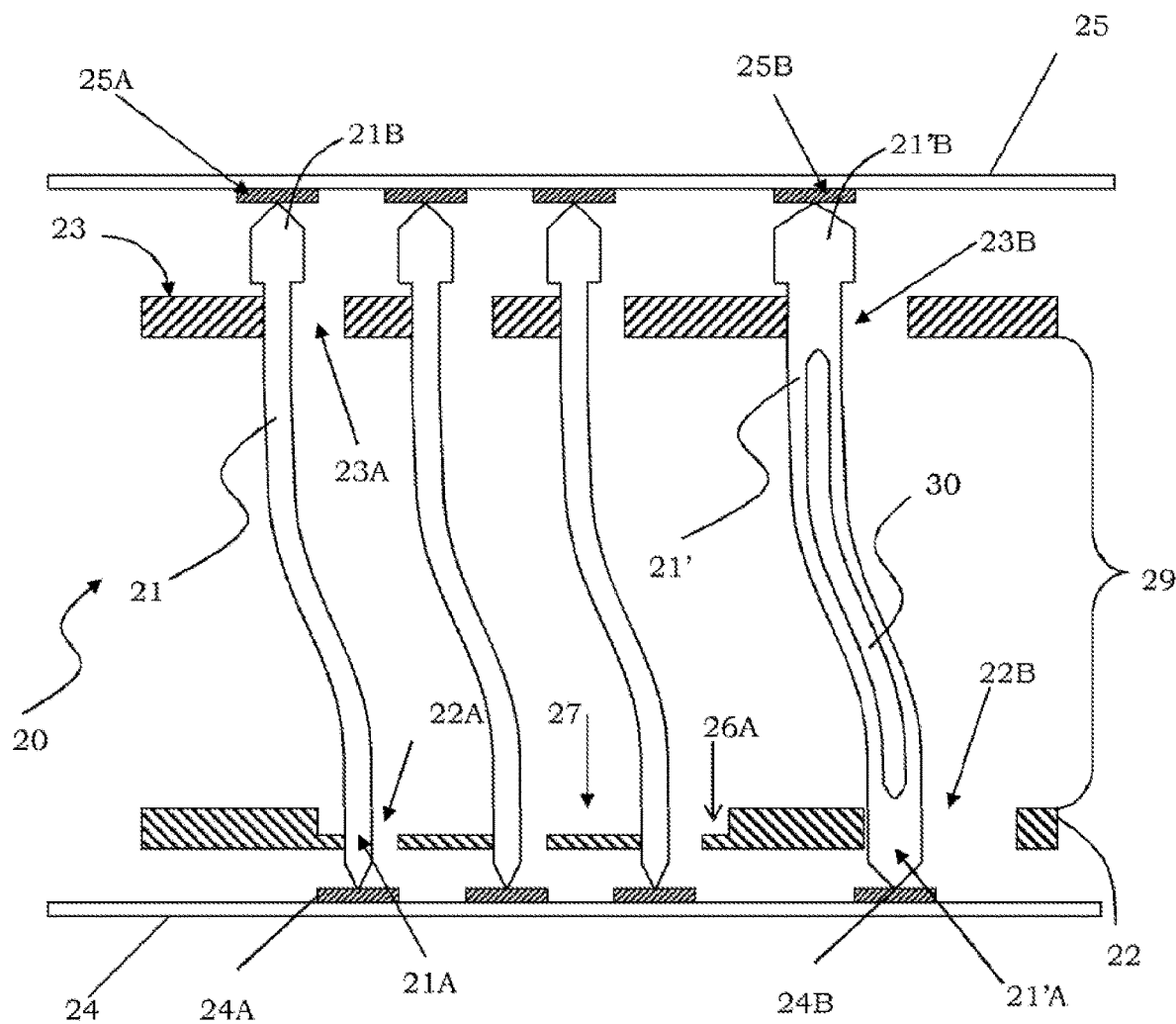

According to an alternative embodiment shown in FIG. 4B, each power contact probe 21' suitably includes an opening 30, which extends longitudinally along its body, substantially over the whole length thereof, substantially in the form of a cut extending along the body of the power contact probe 21' between respective ends, which are placed at the contact head 21'B and at the contact tip 21'A.

In that way, the stiffness of the power contact probe 21' is significantly reduced, which reduces, or even cancels, the risks of breaking its body, also when the body has reduced dimensions suitable for high frequency applications. Moreover, it is verified that the power contact probe 21' exerts less force on a contact pad of a device under test with respect to a known contact probe having the same dimensions, without the opening 30.

Suitably, the power contact probe 21' also includes at least one filling material, in particular a polymer material, which is able to realize a strengthening structure of the body of the contact probe 21' at the opening 30 in order to reduce, or even cancel, the occurrence of cracks or breakages at the end portions of that opening 30, significantly increasing the working life of the contact probe 21' and therefore of the testing head 20 including it.

Alternatively, the filling material can be realized so as to fill the opening 30 and also to coat the whole contact probe 21'. According to an alternative embodiment of the power contact probe 21', it is also possible to realize a plurality of openings, which are substantially parallel to each other.

According to a further embodiment, each power contact probe 21' can alternatively include a non-through groove, instead of the opening 30, the groove however being able to reduce the stiffness of the probe itself and thus the risks of breakage. Also the non-through groove could be filled with a filling and strengthening material, in particular a polymer material, possibly being realized in order to coat also the whole contact probe 21'.

Clearly, it is possible to have applications where it is useful to provide for a recessed portion and corresponding lowered portions also at the guide holes that house the power contact probes 21', in particular in case of high thickness guides. In that case, it would be possible to provide at the guide holes of the signal contact probes 21 for a lowered portion that has a greater thickness than the thickness of the lowered portion at the guide holes of the power contact probes 21', in order to limit the weakening introduced in the guide itself by those lowered portions.

Moreover, it is possible to provide for a recessed portion only for a fine pitch region of the device under test 24, which region for example could correspond only to part of the signal contact probes 21.

Figure 5A:
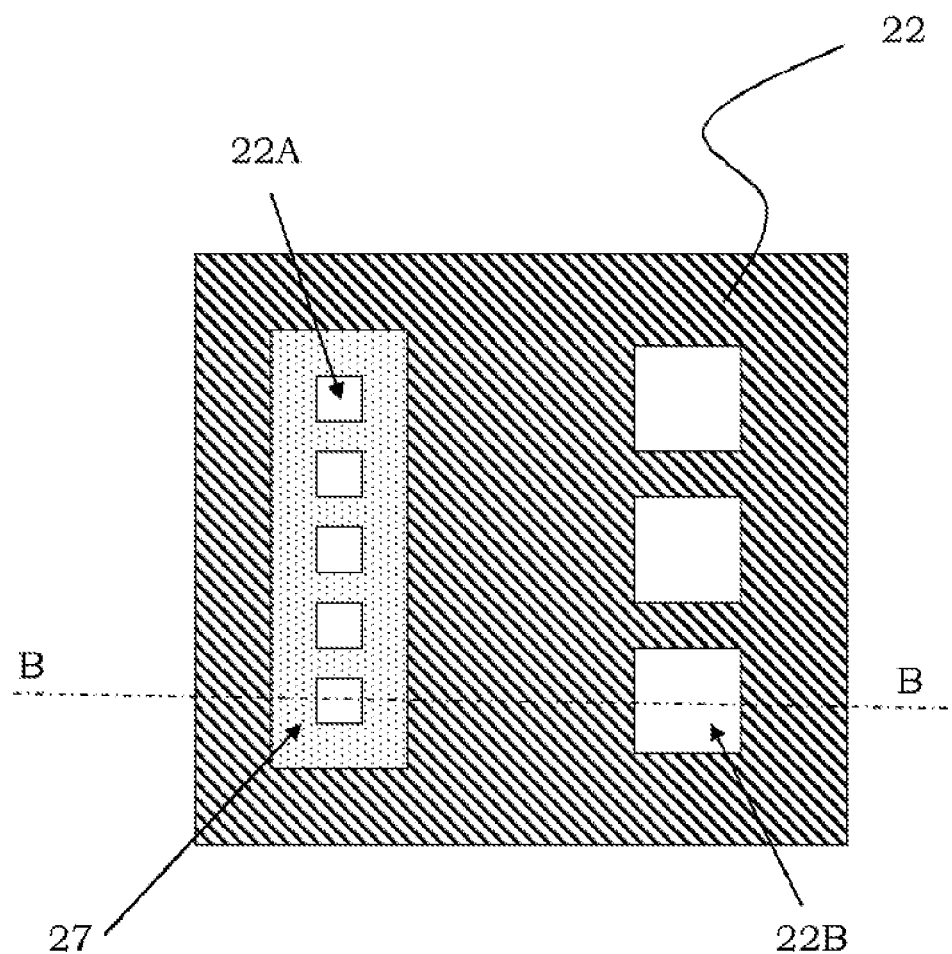
FIGS. 5A and 5B schematically show respective sectional views of a guide of the testing head of FIG. 3A.
Figure 5B:
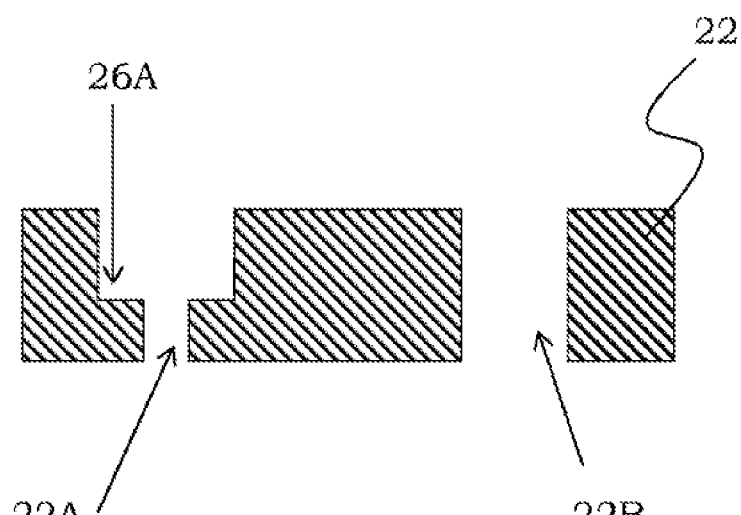

As schematically shown in FIGS. 5A and 5B according to respective top and cross-sectional views, the lower guide 22 comprises the recessed portion 27, which in turn includes the plurality of guide holes 22A, in particular to house contact probes 21 that are used in a fine pitch region, as previously mentioned. In that way, the recessed portion 27 realizes lowered portions 26A at each guide hole 22A included therein. The lower guide 22 can also include further guide holes outside the recessed portion 27, for example the guide holes 22B to house power contact probes 21' that are used outside the fine pitch region.

Clearly, it would be possible to realize the lower guide 22 having further guide holes that are anyway suitable to house signal contact probes 21.

It is also known to use multiple guides in order to realize the lower guide 22 and/or the upper guide 23. In that case, this testing head is referred to as testing head 20 having a double lower and/or a double upper guide and the additional guide is called intermediate or middle guide.

Figure 6A:
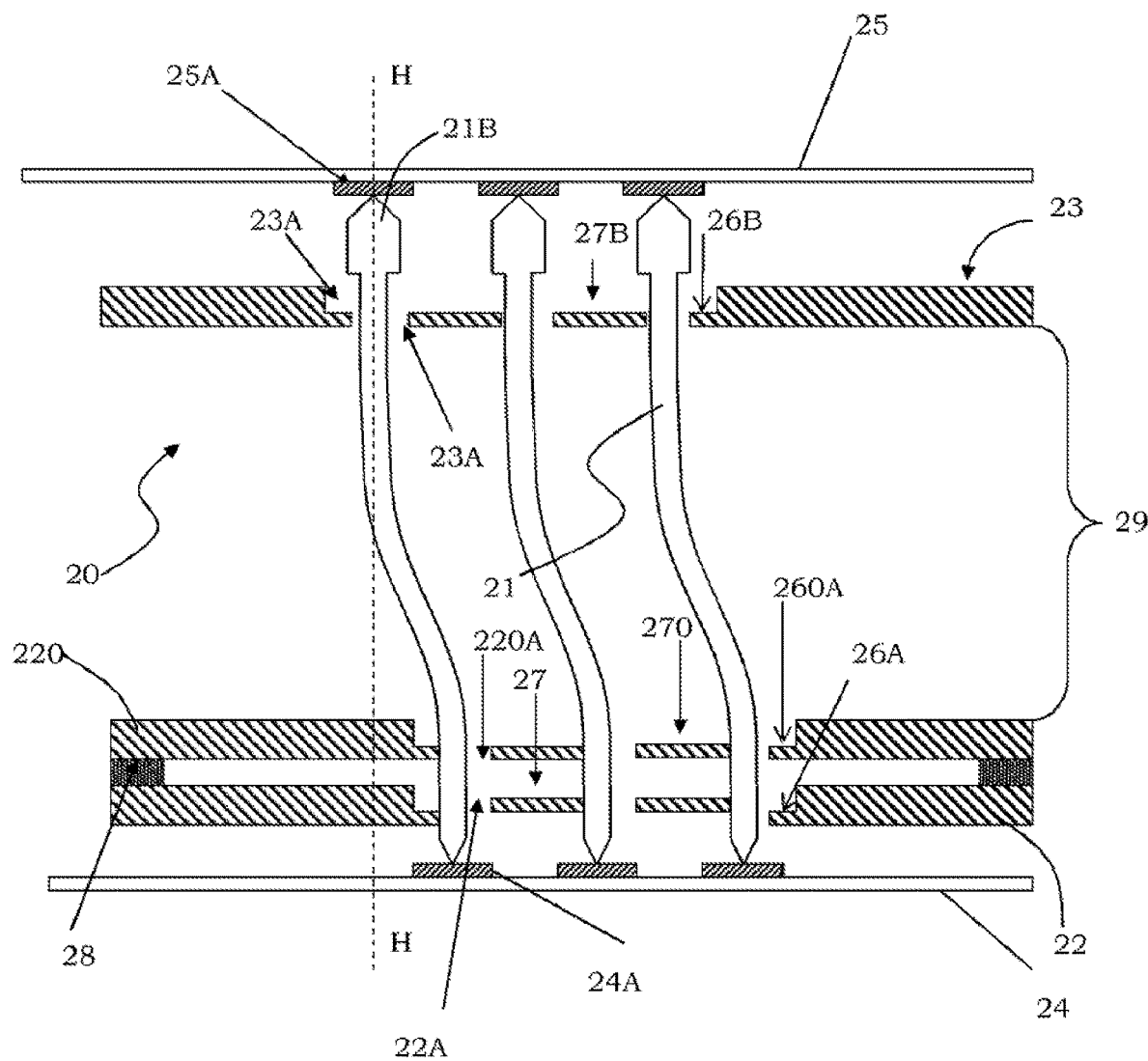
FIGS. 6A-6B and 7A-7B schematically show further alternative embodiments of the testing head according to the disclosure.

In particular, as schematically shown in FIG. 6A, the testing head 20 can include a lower intermediate guide 220, linked to the lower guide 22 by means of a suitable link frame 28, the frame being arranged between the lower intermediate guide 220 and the lower guide 22 in order to act as a spacer element and as a connection element between the guides.

In that case, also the lower intermediate guide 220 can include a recessed portion 270 realizing lowered portions 260A at respective guide holes 220A.

Similarly, the testing head 20 can include an upper intermediate guide 230, linked to the upper guide 23 by means of a suitable additional link frame 28', the frame being arranged between the upper guide 23 and the upper intermediate guide 230, in order to also act as a spacer element and as a connection element between the guides. Similarly, also the upper intermediate guide 230 can include a recessed portion 270B realizing lowered portions 260B at respective guide holes 230A.

Figure 6B:
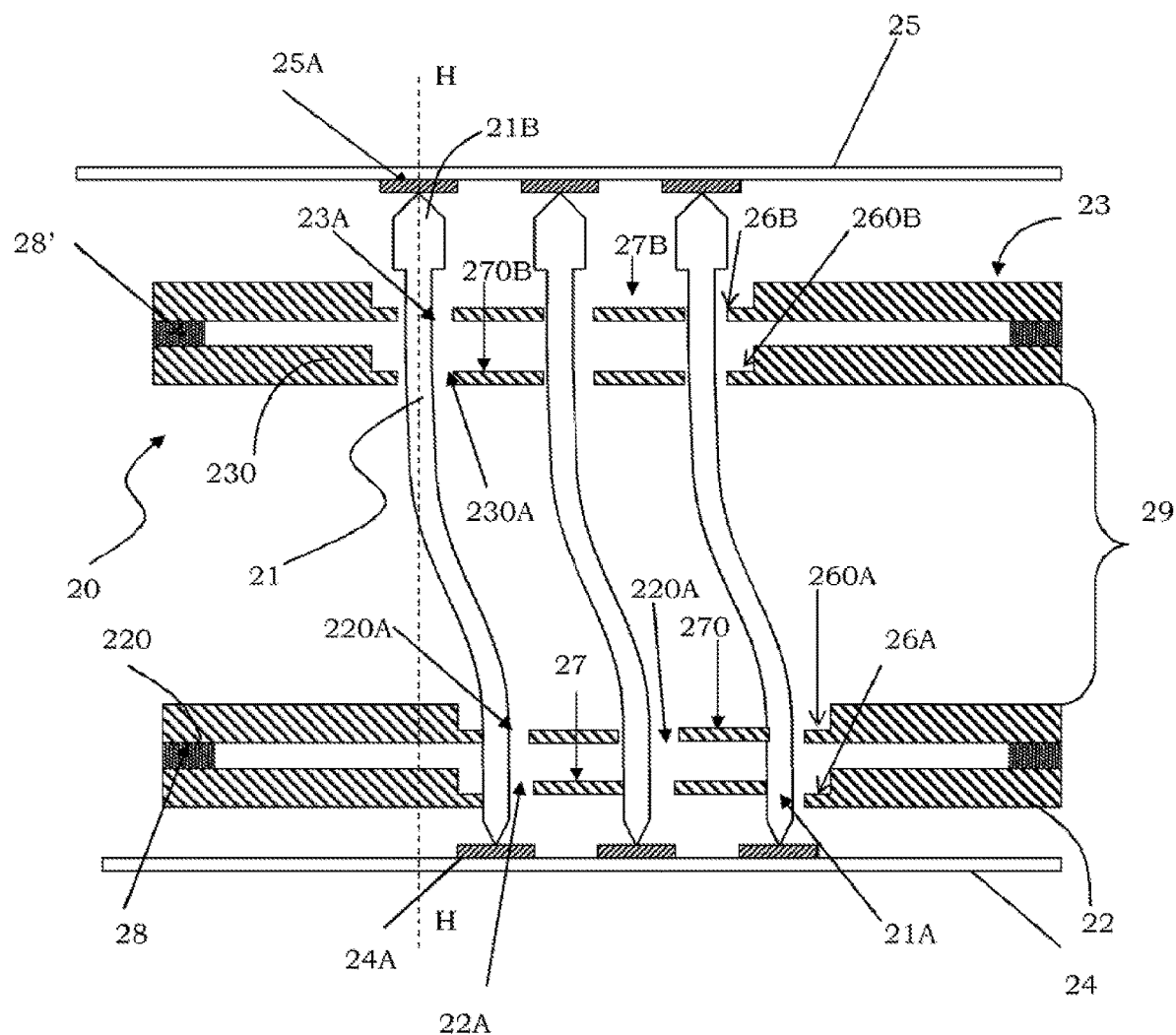

The testing head 20 can also include both the upper intermediate guide 230 provided with the recessed portion 270B and the lower intermediate guide 220 provided with the recessed portion 270, as schematically shown in FIG. 6B.

According to a further alternative embodiment of the present disclosure, it is also possible to realize the testing head 20 provided with recessed portions in the guides 22 and/or 23 that house the contact probes 21, by using a multilayer structure in order to realize those guides.

Figure 7A:
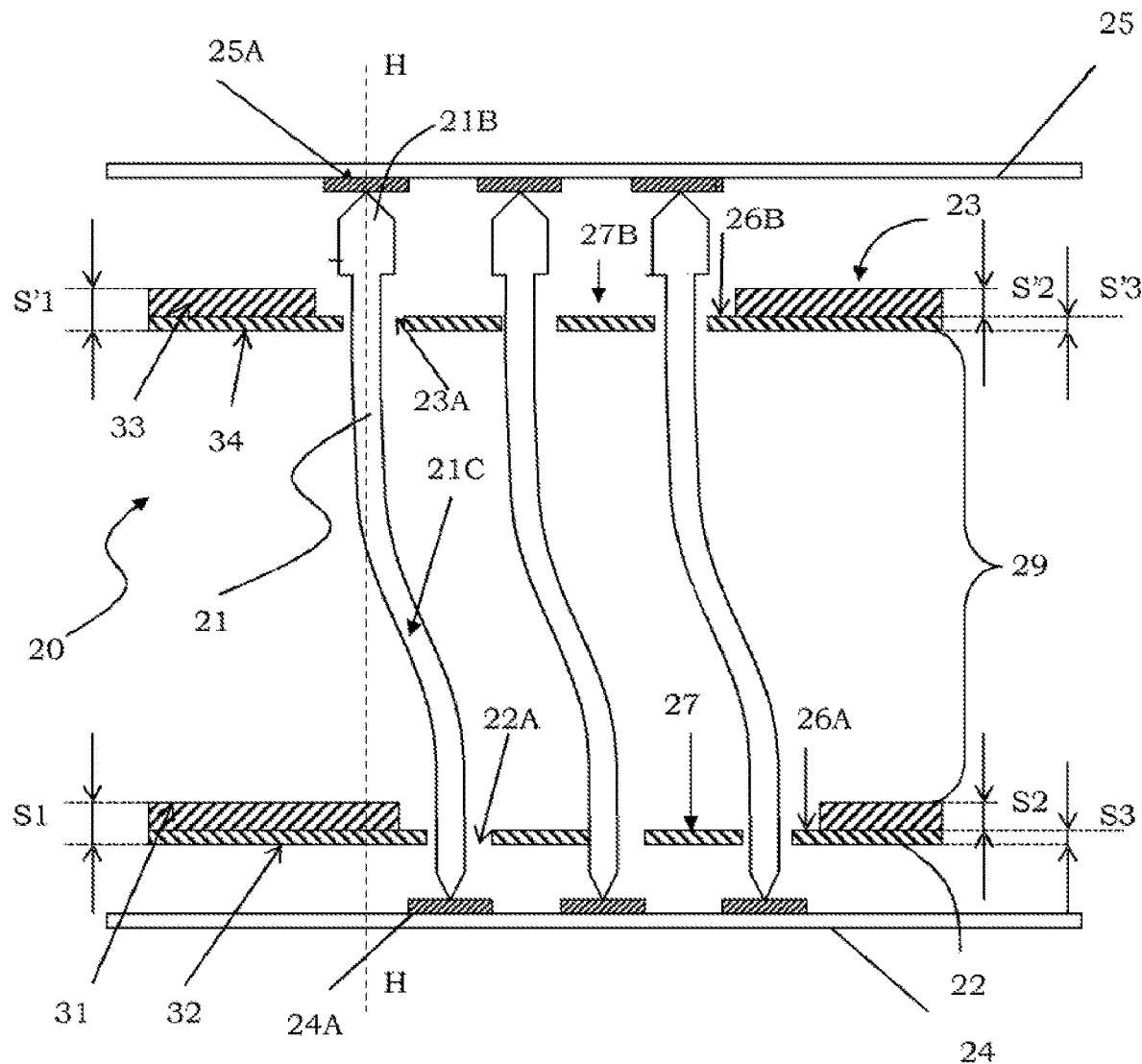

In particular, as schematically shown in FIG. 7A, the testing head 20 includes at least one guide, for example the lower guide 22, formed by at least one first and one second plate-like element, 31 and 32, suitably integral to each other, in particular being overlapped and glued to each other, and having respective thicknesses S2 and S3 lower than a thickness S1 of the lower guide 22 formed by them.

Moreover, the first plate-like element 31 includes an opening having a size greater than the diameter of guide holes 22A that are realized in the second plate-like element 32, that opening corresponding to the recessed portion 27 when the first and second plate-like elements 31 and 32 are overlapped and form the lower guide 22, the guide holes 22A thus being provided with lowered portions 26A due to the recessed portion 27, as previously described, the recessed portion 27 and the lowered portions 26A having dimensions equal to the thickness S2 of the first plate-like element 31 of the lower guide 22.

Similarly, the upper guide 23 can be in turn formed by at least one first and one second plate-like element, 33 and 34, suitably integral to each other, in particular overlapped and glued to each other, and having respective thicknesses S'2 and S'3 lower than a thickness S'1 of the upper guide 23 formed by them.

Also in this case, the first plate-like element 33 includes an opening having a size greater than the diameter of guide holes 23A that are realized in the second plate-like element 34, that opening corresponding to the recessed portion 27B when the first and second plate-like elements 33 and 34 are overlapped and form the upper guide 23, the guide holes 23A of the upper guide 23 thus being provided with lowered portions 26B due the recessed portion 27B, as previously described, the recessed portion 27B and the lowered portions 26B having dimensions equal to the thickness S'2 of the first plate-like element 33 of the lower upper 23.

In the example shown in FIG. 7A, both the lower guide 22 and the upper guide 23 are formed by respective plate-like elements, as described above.

It is also possible to realize the testing head 20 in order to include a lower intermediate guide 220 and/or an upper intermediate guide 230, one or both being formed by respective plate-like elements.

Figure 7B:
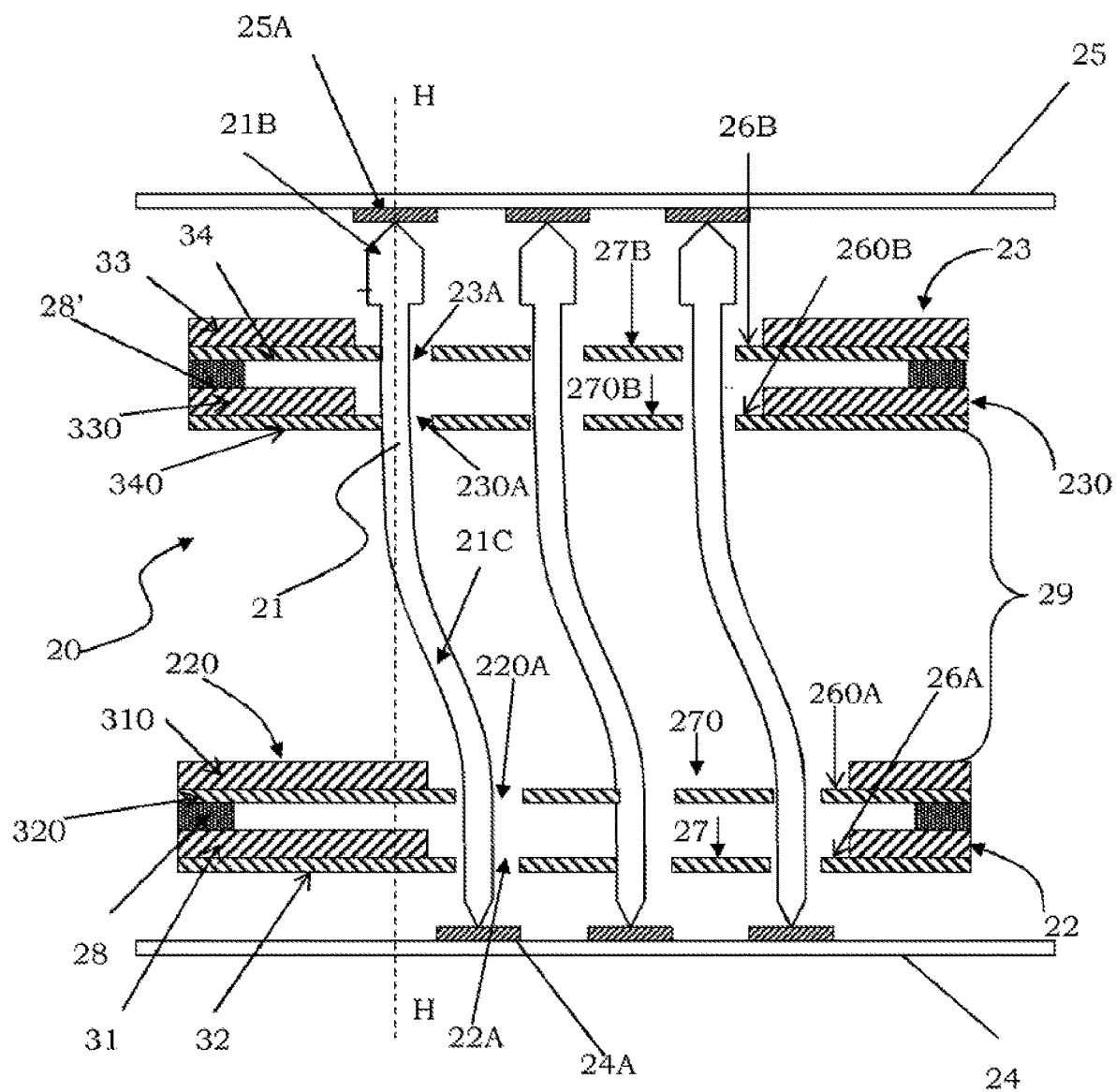

In the example shown in FIG. 7B by way of a non-limiting example, the testing head 20 includes a lower guide 22 that is formed by plate-like elements 31 and 32, which are glued to each other and provided with an opening, corresponding to the recessed portion 27, and respective guide holes 22A, the lower guide 22 being associated to a lower intermediate guide 220 in turn formed by plate-like elements 310 and 320, which are glued to each other and provided with an opening, corresponding to the recessed portion 270, and respective guide holes 220A, as well as includes an upper guide 23 that is formed by plate-like elements 33 and 34, which are glued to each other and provided with an opening, corresponding to the recessed portion 27B, and respective guide holes 23A, the upper guide 23 being associated to an upper intermediate guide 230 in turn formed by plate-like elements 330 and 340, which are glued to each other and provided with an opening, corresponding to the recessed portion 270B, and respective guide holes 230A, the recessed portions 27, 27B, 270, 270B thus realizing lowered portions 26A, 26B, 260A, 260B at those guide holes 22A, 23A, 220A, 230A, respectively.

In one embodiment not shown in the figures, the testing head 20 further includes at least one coating layer of the guides adapted to coat also the guide holes that are realized therein.

In particular, it is possible to consider a coating layer made of a material having a low friction coefficient and having a thickness ranging from 0.5 µm to 3 µm. Preferably, that material is selected from Teflon and Parylene, which are known to be self-lubricating materials, namely materials having a low friction coefficient also without lubrication.

In conclusion, the testing heads that are realized according to the present disclosure have demonstrated to have operation proprieties that are particularly performing and suitable for their use in fine pitch or mixed pitch applications.

The use of a recessed portion realizing lowered portions only at the guide holes of the probes having smaller dimensions and being closer to each other allows reducing the sliding problems due to too much friction of the probes in the guide holes. This reduction of the friction between probes and guide holes is essentially linked to the reduced thickness along which the contact between a probe and a respective guide hole occurs.

Suitably, the testing head to test multi-pitch devices includes contact probes having greater dimensions, for example for a power region, where there are contact pads having greater dimensions and pitches, and contact probes having smaller dimensions and being housed in guide holes provided with local lowered portions due to a recessed portion in a signal region of the device, where there are contact pads having smaller dimensions and pitches, all the probe having a same length.

The local lowered portions do not affect significantly negatively the robustness of the guides inside which they are realized.

The use of guides having locally lowered holes is also preferable in economic terms. Alternatively, however, it is possible to use at least one pair of plate-like elements with a reduced thickness in order to realize guide holes that are provided with lowered portions in correspondence of a recessed portion, those plate-like elements with a reduced thickness unfortunately having breaking problems during the machining, which increase their cost, their initial cost already being greater that the one of the guides with higher thickness.

It is also underlined that the recessed portion of the guide providing the local lowered portions at the guide holes can be used for any guide level (upper die, lower die, intermediate one).

Moreover, by using probes provided with openings or non-through grooves, it is possible to make the testing heads including them suitable for high frequency applications, particularly for frequencies higher than 100 MHz, since the dimensions of the bodies of those probes are reduced to lengths lower than 5000 µm.

In particular, the presence of a cut-shaped opening in the body of the contact probes allows reducing the stiffness of those probes, drastically reducing the likelihood of breakage of the probes themselves and guaranteeing at the same time a proper reduction of the pressure being exerted by the respective contact tips, avoiding possible breakages of the contact pads of the devices under test.

It should be underlined that the reduction of the friction forces inside the testing head results in an enhanced operation thereof, as well as in an extended working life of the individual components, with a consequent cost saving.

Moreover, advantageously according to the present disclosure, the manufacturing process of the testing head is greatly simplified, since the realization of the recessed portion is simpler than the realization of single lowered portions.

The above considerations hold also for different embodiments not explained herein but that are however an object of the present disclosure, such as, for example, a testing head comprising only the upper guide being provided with a recessed portion or an intermediate guide that is not associated to the lower guide and/or upper guide, in case provided with a recessed portion too. Moreover, the expedients adopted in an embodiment can also be adopted in other embodiments and can be freely combinable with each other in a number greater than two.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A testing head comprising:
   a plurality of contact probes, each contact probe having a rod-like body, a first end and a second end, the rod-like body having a predetermined length and extending between the first and second ends; and
   a lower guide and an upper guide each with guide holes for housing the plurality of contact probes, wherein:

the lower and upper guides are parallel to each other and spaced apart by a bending zone; and the lower guide comprises a recessed portion that extends across a plurality of the guide holes and includes lowered portions of reduced thickness at the plurality of guide holes.

2. The testing head according to claim 1, wherein the recessed portion and lowered portions have a thickness equal to 20-80% of a thickness of the lower guide wherein the lowered portions are made.

3. The testing head according to claim 2, wherein the thickness of the recessed portion and lowered portions has a value between 80 µm and 150 µm at the plurality of the guide holes, in which the contact probes slide.

4. The testing head according to claim 1, wherein the upper guide include a recessed portion that extends across plural guide holes and includes lowered portions of reduced thickness at the plural guide holes.

5. The testing head according to claim 1, wherein the plurality of contact probes includes a first plurality of contact probes for contacting pads of a first region of a device under test and a second plurality of contact probes for contacting pads of a second region of the device under test, wherein the pads of the first region have pitches lower than pitches of the pads of the second region.

6. The testing head according to claim 5, wherein the pads of the first region have a diameter smaller than the pads of the second region.

7. The testing head according to claim 5, wherein the contact probes of the first plurality have a probe diameter smaller than a probe diameter of the contact probes of the second plurality, diameter meaning a maximum transverse dimension of a section of the contact probes, which may be non-circular.

8. The testing head according to claim 5, wherein the contact probes of the first plurality are configured to carry input/output signals having current values lower than power signals configured to be carried by the contact probes of the second plurality.

9. The testing head according to claim 5, wherein the contact probes of the second plurality have a body of a length shorter than 5000 µm, and include at least one opening or a non-through groove longitudinally made in the body.

10. The testing head according to claim 1, wherein the plurality of the guide holes made at the recessed portion house contact probes for testing contact pads of a region of the device under test having a lower pitch than the remaining contact probes housed in the testing head, the region being a fine pitch region.

11. The testing head according to claim 1, further comprising at least an intermediate guide associated with the lower guide or with the upper guide.

12. The testing head according to claim 11, wherein the intermediate guide is a lower intermediate guide, linked to the lower guide by a suitable link frame, disposed between the lower intermediate guide and the lower guide and acting as a spacer element and as a connection element between the guides.

13. The testing head according to claim 11, wherein the intermediate guide is an upper intermediate guide, linked to the upper guide by a suitable link frame, disposed between the upper guide and the intermediate upper guide and acting as a spacer element and as a connection element between the guides.

14. The testing head according to claim 11, wherein the intermediate guide comprises a recessed portion realizing lowered portions at guide holes of the intermediate guide.

15. The testing head according to claim 1, wherein:
at least one of the guides is formed by at least one first plate-like element and one second plate-like element that are integral with each other;
the first and second plate-like elements have respective thicknesses lower than a thickness of the guide formed by them;
the first plate-like element is provided with openings and the second plate-like element is provided with guide holes; and
the openings corresponding to recessed portions realizing lowered portions at the guide holes.

16. The testing head according to claim 1, wherein at least one of the guides comprises a plurality of recessed portions having different thicknesses with each other.

17. The testing head according to claim 1, further comprising at least one coating layer on the guides and in the guide holes.

18. The testing head according to claim 17, wherein the coating layer is made of a material having a low friction coefficient.

19. The testing head according to claim 18, wherein the material is selected from Teflon and Parylene.

20. A testing head comprising:
a plurality of contact probes, each contact probe having a rod-like body, a first end and a second end, the rod-like body having a predetermined length and extending between the first and second ends; and
a lower guide and an upper guide each with guide holes for housing the plurality of contact probes, wherein:
the lower and upper guides are parallel to each other and spaced apart by a bending zone; and
at least one of the lower guide and upper guide comprises a recessed portion that that extends across a plurality of the guide holes and includes lowered portions of reduced thickness at the plurality of guide holes.

21. The testing head according to claim 20, wherein the recessed portion and lowered portions have a thickness equal to 20-80% of a thickness of the at least one of the lower guide and upper guide wherein the lowered portions are made.

22. The testing head according to claim 21, wherein the thickness of the recessed portion and lowered portions has a value between 80 µm and 150 µm at the plurality of the guide holes, in which the contact probes slide.

23. The testing head according to claim 20, wherein the plurality of contact probes includes a first plurality of contact probes for contacting pads of a first region of a device under test and a second plurality of contact probes for contacting pads of a second region of the device under test and wherein the pads of the first region have pitches lower than pitches of the pads of the second region, the pads of the first region having a diameter smaller than the pads of the second region and the contact probes of the first plurality having a probe diameter smaller than a probe diameter of the contact probes of the second plurality, diameter meaning a maximum transverse dimension of a section of the contact probes, which may be non-circular.

24. The testing head according to claim 20, wherein the plurality of the guide holes made at the recessed portion house contact probes for testing contact pads of a region of the device under test having a lower pitch than the remaining contact probes housed in the testing head, the region being a fine pitch region.

25. The testing head according to claim 20, further comprising at least an intermediate guide associated with the lower guide or with the upper guide.

26. The testing head according to claim 25, wherein the intermediate guide is a lower intermediate guide, linked to the lower guide by a suitable link frame, disposed between the lower intermediate guide and the lower guide and acting as a spacer element and as a connection element between the guides.

27. The testing head according to claim 25, wherein the intermediate guide is an upper intermediate guide, linked to the upper guide by a suitable link frame, disposed between the upper guide and the intermediate upper guide and acting as a spacer element and as a connection element between the guides.

28. The testing head according to claim 25, wherein the intermediate guide comprises a recessed portion that includes a plurality of guide holes of the intermediate guide and realizes corresponding lowered portions.

29. The testing head according to claim 20, wherein:
at least one of the guides is formed by at least one first plate-like element and one second plate-like element that are integral with each other;
the first and second plate-like elements have respective thicknesses lower than a thickness of the guide formed by them;
the first plate-like element is provided with openings and the second plate-like element being provided with guide holes; and
the openings corresponding to recessed portions realizing lowered portions at the guide holes.

30. The testing head according to claim 20, further comprising at least one coating layer on the guides and in the guide holes, the coating layer being made of a material having a low friction coefficient selected from Teflon and Parylene.

* * * * *